United States Patent
Koh et al.

(10) Patent No.: US 7,081,043 B2
(45) Date of Patent: Jul. 25, 2006

(54) MOLDED ABRASIVE BRUSH AND METHODS OF USING FOR MANUFACTURE OF PRINTED CIRCUIT BOARDS

(75) Inventors: Siong Hong Koh, Singapore (SG); Richard M. Pihl, Cottage Grove, MN (US); Masashi Nakayama, Sagamihara (JP)

(73) Assignee: 3M Innovative Properties Company, St. Paul, MN (US)

( * ) Notice: Subject to any disclaimer, the term of this patent is extended or adjusted under 35 U.S.C. 154(b) by 197 days.

(21) Appl. No.: 10/756,902

(22) Filed: Jan. 14, 2004

(65) Prior Publication Data

US 2005/0153558 A1 Jul. 14, 2005

(51) Int. Cl.
B24B 1/00 (2006.01)

(52) U.S. Cl. .................. 451/49; 451/359; 451/28

(58) Field of Classification Search .......... 451/49, 451/59, 530–533, 359, 41, 28; 51/298, 295, 51/299; 15/230.12, 230.14, 230.16
See application file for complete search history.

(56) References Cited

U.S. PATENT DOCUMENTS

| | | | |
|---|---|---|---|
| 3,795,931 A | 3/1974 | Martino | |
| 4,314,827 A | 2/1982 | Leitheiser et al. | |
| 4,382,308 A | 5/1983 | Curcio | |
| 4,623,364 A | 11/1986 | Cottringer et al. | |
| 4,744,802 A | 5/1988 | Schwabel | |
| 4,770,671 A | 9/1988 | Monroe et al. | |
| 4,881,951 A | 11/1989 | Wood et al. | |
| 4,964,883 A | 10/1990 | Morris et al. | |
| 5,009,676 A | 4/1991 | Rue et al. | |
| 5,011,508 A | 4/1991 | Wald et al. | |
| 5,164,348 A | 11/1992 | Wood | |
| 5,185,012 A | 2/1993 | Kelly | |
| 5,244,477 A | 9/1993 | Rue et al. | |
| 5,327,601 A | 7/1994 | Nakayama et al. | |
| 5,372,620 A | 12/1994 | Rowse et al. | |
| 5,427,595 A | 6/1995 | Pihl et al. | |
| 5,491,025 A | 2/1996 | Pihl et al. | |
| 5,500,273 A | 3/1996 | Holmes et al. | |
| 5,616,411 A * | 4/1997 | Barber et al. ............... | 428/373 |
| 5,632,790 A | 5/1997 | Wiand | |
| 5,679,067 A | 10/1997 | Johnson et al. | |
| 5,849,052 A | 12/1998 | Barber, Jr. | |
| 5,903,951 A | 5/1999 | Ionta et al. | |
| 5,915,436 A | 6/1999 | Johnson et al. | |
| 5,964,006 A | 10/1999 | Holmes et al. | |
| 5,983,434 A | 11/1999 | Eichinger et al. | |
| 6,095,910 A | 8/2000 | Luedeke | |
| 6,126,533 A | 10/2000 | Johnson et al. | |
| 6,138,317 A | 10/2000 | Holmes et al. | |
| 6,179,887 B1 * | 1/2001 | Barber, Jr. .................. | 51/298 |
| 6,261,156 B1 * | 7/2001 | Johnson et al. ............... | 451/41 |
| 6,352,471 B1 | 3/2002 | Bange et al. | |
| 6,413,287 B1 | 7/2002 | Barber, Jr. | |
| 6,442,932 B1 | 9/2002 | Hofmann et al. | |
| 6,554,614 B1 | 4/2003 | Dubbe et al. | |
| 2002/0065031 A1 | 5/2002 | Chou et al. | |
| 2004/0185762 A1 * | 9/2004 | Turch et al. ................ | 451/490 |
| 2005/0153558 A1 * | 7/2005 | Koh et al. .................. | 438/692 |

* cited by examiner

*Primary Examiner*—Lee D. Wilson (57) ABSTRACT

A molded brush segment having a plurality of integrally molded bristles extending from a generally planar center portion. The brush segment is molded from a moldable polymer, such as a thermoplastic elastomer, and has a plurality of abrasive particles present in at least the bristles of the brush segment.

16 Claims, 6 Drawing Sheets

MOLDED ABRASIVE BRUSH AND METHODS OF USING FOR MANUFACTURE OF PRINTED CIRCUIT BOARDS

FIELD OF THE DISCLOSURE

This disclosure is directed to an abrasive brush, methods of making, and methods of using the brush for printed circuit boards.

BACKGROUND

Printed circuit boards (PCBs) are ubiquitous in manufactured products with electronic components. During the manufacture of PCBs, a copper layer is laminated to a composite insulating board (frequently epoxy-glass). Holes are then drilled in prescribed locations in the laminate. Prior to subsequent manufacturing steps, it is vital that vestigial burrs from the drilling step be removed and that the surface of the composite board is thoroughly cleaned. Rotary brushes are typically employed to perform this deburring step. Rotary brushes may be bristle brushes. Alternatively, the brushes may be composed of nonwoven fabric, either in the form of ganged discs or radially-disposed strips bonded to a central core (flap brushes). Nonwoven brushes provide efficient deburring and long product life, but in some applications may allow detritus from the brushing action to become embedded in the pre-drilled board.

There is a need for a PCB brush providing suitable finish to assure good adhesion of subsequent coatings, good deburring efficiency, and long life while minimizing plugged holes.

SUMMARY

The present invention is directed to a method of using a bristle brush on printed circuit boards. The method uses radial bristled brush, having a plurality of abrasive particles dispersed throughout polymeric bristles. The bristles have a preferred hardness and stiffness, which is a function of the polymeric material and concentration of abrasive particles present in the bristles. The polymeric material includes a lubricant.

In one particular aspect, the invention is directed to a method of refining a surface of a printed circuit board, the method comprising providing a brush segment, contacting the brush with the surface of a printed circuit board comprising a copper surface and having apertures therethrough; and refining the surface to provide a copper surface having an acceptable surface finish and to provide acceptable apertures. The brush as a plurality of bristles integrally molded with a central portion of the brush, the bristles comprising thermoplastic polymer, polysiloxane lubricant, and silicon carbide abrasive particles, the thermoplastic polymer having a Shore D hardness of 55–90. Alternately, the brush can comprise a thermoplastic polymer having a Shore D hardness of 70–85. The polysiloxane can be present at levels of 2–20 wt-%, or 5–15 wt-%, and the silicon carbide particles at 20–45 wt-%. The plurality of bristles can have a length of 0.0625 inch to 1.5 inch, or even 0.25 inch to 0.5 inch. Cross-sectional dimensions can be 0.01 to 0.05 inch wide and 0.01 to 0.05 inch high, or even 0.25 inch wide and 0.25 inch high. The cross-section can be trapezoidal.

The invention is also directed to the brush used for refining.

BRIEF DESCRIPTION OF THE DRAWINGS

The present invention will be further explained with reference to the appended figures, wherein like structure is referred to by like numerals throughout the several views, and wherein.

DETAILED DESCRIPTION OF THE PREFERRED EMBODIMENT

This invention is directed to an abrasive brush segment, and in particular a molded radial abrasive brush segment, and use of a plurality of the brush segments during the manufacture of printed circuit boards. The invention is also directed to methods of making a molded radial brush segment and in particular an abrasive brush segment, a brush assembly and particularly an abrasive brush assembly, and a method of using the aforementioned brushes for manufacture of printed circuit boards. In particular, the molded radial brush segments.

Figure 1:
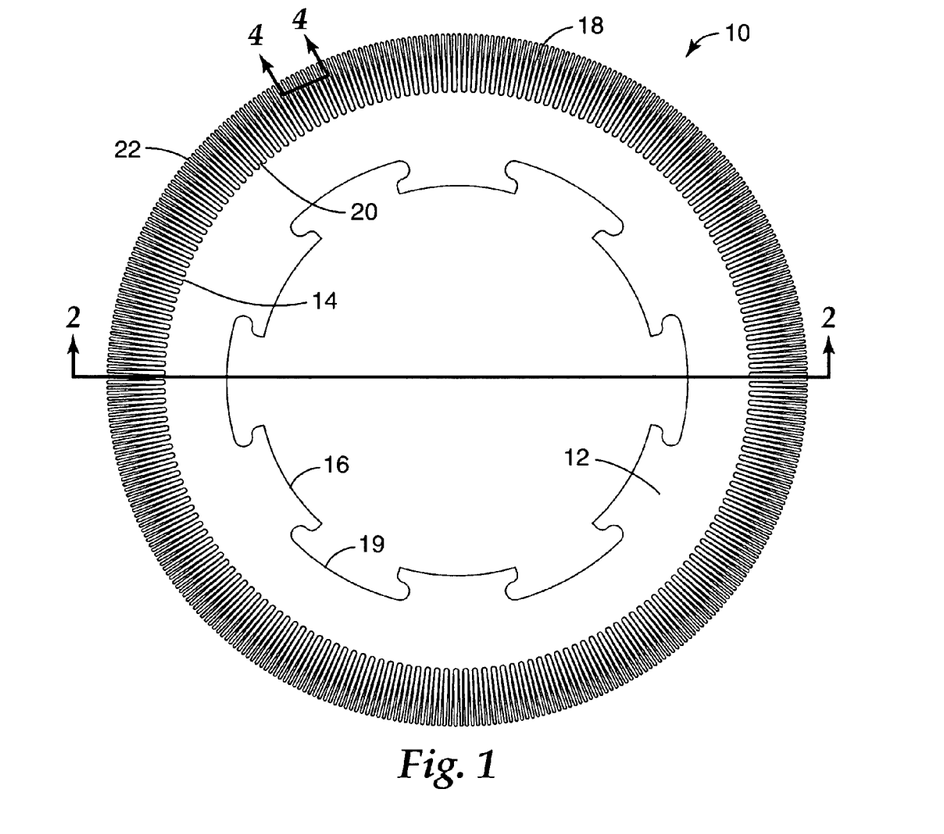
FIG. 1 is a plan view of a radial abrasive brush segment according to the present invention.
Figure 2:
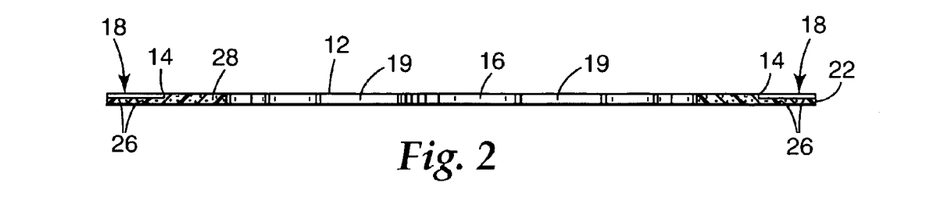
FIG. 2 is a cross-sectional view of the brush segment of FIG. 1, taken along line 2—2.

Referring to FIGS. 1 and 2, abrasive brush segment 10 has a center portion 12 having outer edge 14 and inner edge 16. A plurality of bristles 18 project outwardly from outer edge 14, beginning at bristle roots 20 and ending at bristle tips 22. There may be spaces between bristle roots 20 in which outer edge 14 of center portion 12 is exposed. Alternatively, adjacent bristles may adjoin one another at roots 20. Brush segment 10 is integrally molded such that bristles 18 and center portion 12 are continuous with one another; that is, there is no material bread between center portion 12 and bristles 18. In one preferred embodiment, brush segment 10 is an abrasive brush segment which comprises a generally homogenous composition of abrasive particles 26 in a moldable polymer 28.

Figure 3:
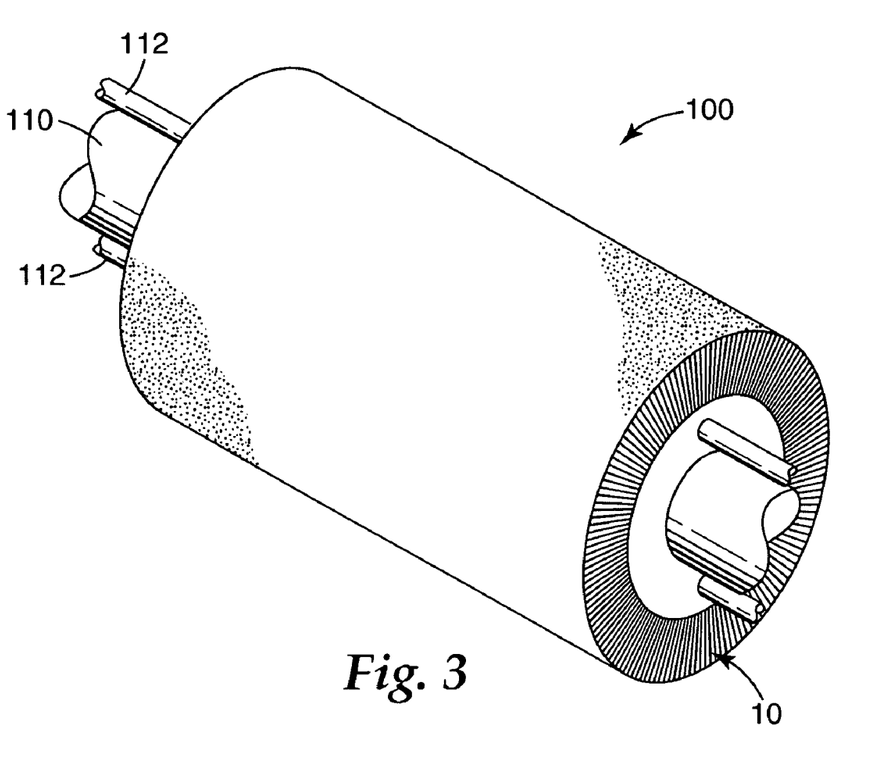
FIG. 3 is an isometric view of a plurality of brush segments of FIG. 1 assembled onto a shaft forming a brush.
Figure 4A:
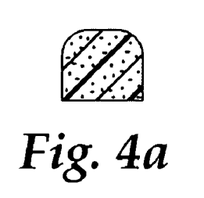
FIGS. 4a–d are cross-sectional view of various embodiments of a bristle of a brush segment of the present invention, taken along line 4—4 of FIG. 1.
Figure 4B:
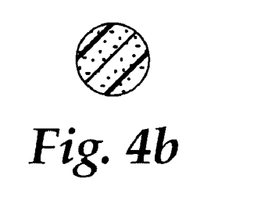
Figure 4C:
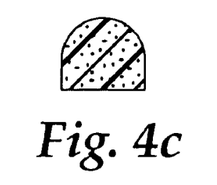
Figure 4D:
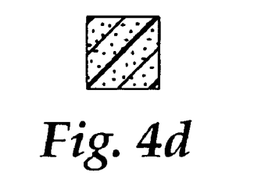

As illustrated in FIG. 3, a plurality of brush segments 10 can be assembled onto a shaft 110 to form a brush assembly 100. Any number of segments 10 may be assembled together to provide assembly 100 of any desired width. Preferably, the brush segments 10 are adjacent one another such that there is essentially no space between the brush segments, although alternatively, segments 10 may be assembled onto to shaft 110 so as to have space between adjacent brush segments. There may be 5 to 10,000 brush segments 10 assembled together to form assembly 100, although more or less may be used as desired. A means for providing segment-to-segment engagement may be included to reduce or eliminate rotation of adjacent brush segments relative to one another. Such engagement means can include, for example, an interengaging hole and dimple pattern on the surfaces of center portion 12 or, alternatively, radially-disposed keyways.

Center Portion

In the embodiment illustrated in FIG. 1, center portion 12 is a continuous circumferential portion that is generally planar. It is also within the scope of the invention to have a contoured or curved center portion. For example, center portion 12 may be convex, concave, or conical in shape.

Brush segment 10 may optionally have an attachment means on center portion 12, such as a channel, keyway, or a root to mechanically join several brush segments together on shaft 110 to provide brush assembly 100. Illustrated in FIG. 1, center portion 12 includes six evenly spaced keyways 19 for attaching brush segment 10 to a core. Brush assembly 100 of FIG. 3 includes two locking rods 112 inserted through apertures within center portion 12 (not illustrated in FIG. 1). Shaft 110 and locking rods 112 may then be attached to a suitable rotary drive means.

Center portion 12 typically has a thickness of about 0.5 to 25 mm. Preferably, the thickness is about 1 to 10 mm, and more preferably about 1.0 to 6 mm. Center portion 12 is preferably circular and may have keyways disposed therein or therethrough as illustrated in FIG. 1, although shapes other than circular are also within the scope of the invention, including, but not limited to, oval, rectangular, square, triangular, diamond, and other polygonal shapes.

The diameter of the outer edge 14 of center portion 12 is typically about 2.5 to 60 cm, although smaller and larger center portions are also within the scope of the invention. Center portion 12 generally has a diameter no greater than 90% of the diameter of segment 10.

As stated above, center portion 12 is preferably molded integrally with the bristles 18 to provide a unitary brush segment; that is, no adhesive or mechanical means is required to adhere bristles 18 to center portion 12.

It is preferred that center portion 12 and bristles 18 are molded simultaneously. To make an abrasive brush segment, there may be a single mixture of abrasive particles 26 and moldable polymer 28 placed in the mold in a single injection process. In such an embodiment, the abrasive brush segment comprises a generally homogenous composition throughout. However, due to the molding process, the abrasive particle/binder mix may not be perfectly homogeneous. For example, as the polymer and abrasive mix is injected into the mold, the narrow bristle cavities may cause more polymer to initially cool adjacent the inside of the bristle cavity near the base, forcing a mix having a somewhat higher concentration of abrasive particles toward tip 22 of the bristle.

Alternatively, there may be two or more insertions of a moldable polymer 28 to the mold. For example, one insertion may contain a mixture of moldable polymer 28 and abrasive particles 26, located primarily in bristles 18. A second insertion may contain moldable polymer 28 without abrasive particles 26, or with fewer or a different type of abrasive particle, located primarily in center portion 12 of brush segment 10. It is also within the scope of this invention to have two insertions, both containing abrasive particles. The first insertion may have abrasive particles of a certain size, material, and/or hardness, while the second insertion may include different abrasive particles. During abrading, the abrasive particles nearer tip 22 are used first, and then the abrasive particles nearer root 20 are used. In yet another example of two or more insertions, the first insertion may have a first moldable polymer 28 and the second insertion may have a second, different, moldable polymer 28.

Center portion 12 may include a reinforcing means to increase the flexural strength and tensile strength of brush segment 10. Examples of suitable reinforcing means includes fabric, non-woven sheeting, mat, mesh, scrim, and the like, or individual fibers compounded into moldable polymer 28 and dispersed throughout the brush segment 10. Examples of reinforcing fibers suitable for use in the present invention include glass fibers, metal fibers, carbon fibers, wire mesh, mineral fibers, fibers formed of heat resistant organic materials, or fibers made from ceramic materials. Ether organic fibers include polyvinyl alcohol fibers, nylon fibers, polyester fibers and phenolic fibers. If glass fibers are used, the moldable polymer mixture may preferably contain a coupling agent, such as a silane coupling agent, to improve the adhesion to the thermoplastic material. The reinforcing means may optionally contain a treatment to modify its physical properties.

Bristles

Bristles 18 extend from outer edge 14 of center portion 12, beginning at root 20 and ending at tips 22 remote from center portion 12. In one preferred embodiment, bristles 18 extend radially from the outer edge 14 of the center portion 12, and are coplanar with the center portion 12. Bristles 18 preferably extend from outer edge 14 of center portion 12 in a plane parallel to the plane of center portion 12.

It is preferable that there is a single row of bristles 18 arranged around the outer edge 14, although, a double row or other multiplicity row of bristles may be formed.

Bristles 18 may have any cross sectional shape, including but not limited to, circular, star, half moon, quarter moon, oval, rectangular, square, triangular, diamond, or other polygonal shape. Some exemplary cross sections are illustrated in FIGS. 4a through 4d and FIG. 5. In one preferred embodiment, bristles 18 have a non-constant or variable cross section along the length of the bristle. In other embodiments, bristles 18 will have a constant cross section along the length of bristle 18.

Figure 6:
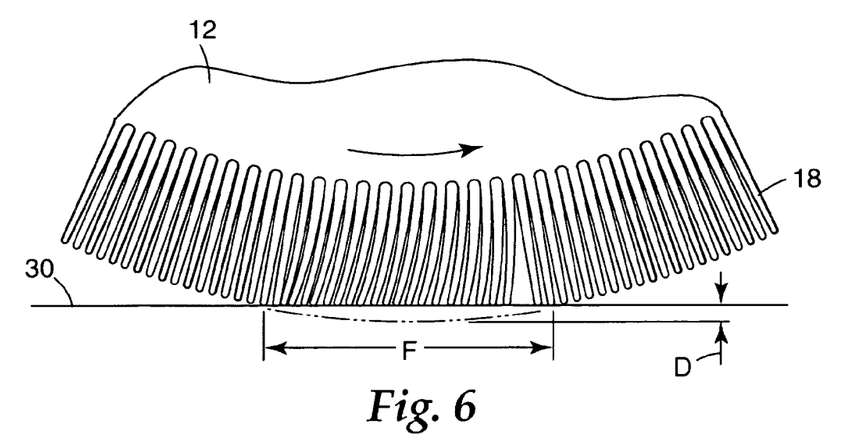
FIG. 6 is a schematic depiction of a brush segment of the present invention illustrating the deflection of the bristles during modifying a printed circuit board surface.

Bristles 18 may be tapered such that the cross sectional area of the bristle decreases in the direction away from root 20 towards tip 22. Bristles 18 can have a taper along the entire length, or can have a tapered portion adjacent the root 20 and a constant cross sectional area for the remainder of the bristle. Tapered bristles 18 can have any cross section as described above. Bristles 18 are subjected to bending stresses as brush segment 10 is rotated against a circuit board surface, as illustrated in FIG. 6. These bending stresses are highest at the root 20 of bristles 18 (at outer edge 14). Therefore, a tapered bristle is more able to resist bending stresses than a bristle of constant cross sectional area. A fillet radius at the transition between root 20 of bristle 18 and outer edge 14 of center portion 12 also increases resistance to bending stresses.

Bristles 18 have an aspect ratio defined as the length of bristle 18 measured from outer root 20 to tip 22, divided by the width of the bristle. For a tapered bristle, the width is defined as the average width along the length for purposes of determining the aspect ratio. For bristles 18 having a non-circular cross section shape, the width is taken as the longest width in a given plane, such as the corner-to-corner diagonal of a square cross section. The aspect ratio of bristles 18 is at least 2, preferably about 5 to 100, and more preferably about 5 to 20.

The size of bristles 18 can be selected for the particular application of brush segment 10 and brush 100. The length of bristles 18 is about 0.2 to 50 cm, preferably about 0.5 to 25 cm, and more preferably about 0.5–5 cm. The width of bristles 18 is about 0.25 to 10 mm, preferably about 0.5 to 5 mm. The width of bristles 18 can be the same as or different from the thickness of center portion 12. In one preferred embodiment, all of the bristles 18 have the same dimensions. Alternatively, bristles 18 on brush 100 comprising a plurality of brush segments 10 may have different dimensions, such as different lengths, widths or cross sectional areas. For example, brush assembly 100 illustrated in FIG. 3 could employ adjacent brush segments 10 having different bristles.

The density and arrangement of bristles 18 can be chosen for the particular application of brush segment 10 and brush 100; in accord with this application, bristles 18 are adapted for use on printed circuit boards.

The material, length, and configuration of the bristles are chosen so that bristles 18 are sufficiently flexible to aid in refining printed circuit boards. The bristles 18 are preferably capable of bending at least 1 degree without damage or substantial permanent deformation to the bristles.

It is possible to reinforce the bristles 18 with any suitable structure. For example, it is possible to place a reinforcing fiber or wire in the bristle mold cavities, and inject moldable polymer 28 around the reinforcing wire. This will result in a bristle 18 having a reinforcing wire or fiber embedded within it.

Figure 5:
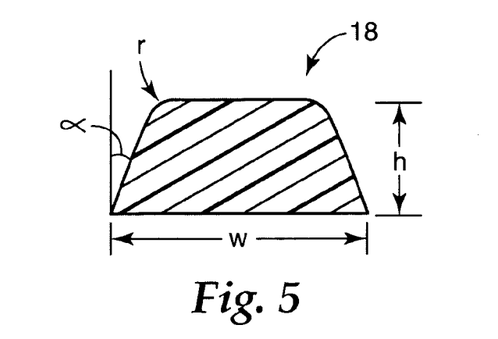
FIG. 5 is a cross-sectional view of a preferred embodiment of a bristle, similar to FIGS. 4a–d.

In one preferred embodiment of the brush segment illustrated in FIGS. 1–2, the center portion 12 has an outer diameter at edge 14 of approximately 12.7 cm, an inner diameter at edge 16 of approximately 8.6 cm, and a thickness of approximately 1.37 mm, with 10 bristles/cm 18 extending radially outward from edge 14 in the plane of the center portion 12. Each bristle 18 is approximately 1.27 cm long and tapers from approximately 1.0 mm thick at root 20 to approximately 0.6 mm thick at tip 22, with a preferred cross-section generally as illustrated in FIG. 5. Bristle 18 may have a taper of approximately 2° from root 20 to tip 22.

One preferred cross-sectional configuration for bristle 18 is a trapezoid, having a width "w" of about 0.25 to 1.25 mm, a height "h" of about 0.25 to 1.25 mm, and an angle $\alpha$ of about 5 degrees. The side having the shorter width includes radiused corners, defined by a radius "r" of about 0.05 to 0.13 mm. See, FIG. 5. Such radiused outer corners are typically due to manufacturing tolerances.

Another particular embodiment of bristle 18 has a length, from root 20 to tip 22 of 12.7 cm with a 2 degree taper, and a cross-sectional width "w" of 0.64 mm, a height "h" of 0.64 mm an angle $\alpha$ of 5 degrees, and an internal radius "r" of 0.127 mm.

Attachment Means

Brush segment 10 preferably includes an attachment system for joining several brush segments together to form a brush assembly, or for attaching one or more brush segments 10 to a support means such as a hub or shaft. As illustrated in FIG. 1, center section 12 has inner edge 16 configured with keyways 19 to engage with channels in a core or a shaft. In an alternate design, illustrated in FIG. 3, center section 12 includes mounting apertures for accepting locking rods 112, to hold segments 10 together on shaft 110. Alternate attachment systems could alternately or additional be used. For example, brush segment 10 could include a mounting root configured to engage with a complementary configured slot in shaft 110.

Moldable Polymer

Moldable polymer material 28 is preferably an organic binder material that is capable of being molded, i.e., it is capable of deforming under heat to form a desired shape. Moldable polymer 28 may be a thermosetting polymer, a thermoplastic polymer, a thermoplastic elastomer, or combinations thereof.

Thermosetting Polymers

The brush segment according to the present invention may be made from a thermosetting polymer. Organic material is placed into the mold, typically in a liquid or flowing state. Next, the brush segment is usually heated to cause this organic binder to crosslink and form a thermosetting polymer. Various catalysts may be used to facilitate the crosslinking processes. Examples of suitable thermosetting polymers include styrene butadiene rubber, polyurethane, urea-formaldehyde, epoxy, and phenolics.

Thermoplastic Polymers

The brush segment according to the present invention may be made from a thermoplastic polymer. In the case of a thermoplastic polymer, the organic binder is heated above its melting point which causes the polymer to flow. This results in the thermoplastic polymer flowing into the cavities of the mold to form brush segment 10. The brush segment is then cooled to solidify the thermoplastic binder. Examples of suitable thermoplastic polymers include polycarbonate, polyetherimide, polyester, polyethylene, polysulfone, polystyrene, polybutylene, acrylonitrile-butadiene-styrene block copolymer, polypropylene, acetal polymers, polyurethanes, polyamides, and combinations thereof. In general, preferred thermoplastic polymers are those having a high melting temperature and good heat resistance properties.

Thermoplastic Elastomers

In some instances, it is preferred that moldable polymer 28 is a thermoplastic elastomer or includes a thermoplastic elastomer. Thermoplastic elastomers (or "TPEs") are defined and reviewed in "Thermoplastic Elastomers, A Comprehensive Review", edited by N. R. Legge, G. Holden and H. E. Schroeder, Hanser Publishers, New York, 1987 (referred to herein as "Legge et al.", the entire disclosure of which is incorporated by reference herein). Thermoplastic elastomers (as used herein) are generally the reaction product of a low equivalent weight polyfunctional monomer and a high equivalent weight polyfunctional monomer, wherein the low equivalent weight polyfunctional monomer has a functionality of at most about 2 and equivalent weight of at most about 300 and is capable on polymerization of forming a hard segment (and, in conjunction with other hard segments, crystalline hard regions or domains) and the high equivalent weight polyfunctional monomer has a functionality of at least about 2 and an equivalent weight of at least about 350 and is capable on polymerization of producing soft, flexible chains connecting the hard regions or domains.

"Thermoplastic elastomers" differ from "thermoplastics" and "elastomers" (a generic term for substances emulating natural rubber in that they stretch under tension, have a high tensile strength, retract rapidly, and substantially recover their original dimensions) in that thermoplastic elastomers, upon heating above the melting temperature of the hard regions, form a homogeneous melt which can be processed by thermoplastic techniques (unlike elastomers), such as injection molding, extrusion, blow molding, and the like. Subsequent cooling leads again to segregation of hard and soft regions resulting in a material having elastomeric properties, which does not occur with thermoplastics. Thermoplastic elastomers combine the proccessability (when molten) of thermoplastic materials with the functional performance and properties of conventional thermosetting rubbers (when in their non-molten state), and which are described in the art as ionomeric, segmented, or segmented ionomeric thermoplastic elastomers. The segmented versions include "hard segments" which associate to form crystalline hard domains connected together by "soft", long, flexible polymeric chains. The hard domain has a melting or disassociation temperature above the melting temperature of the soft polymeric chains. Thermoplastic elastomers are further described in U.S. Pat. No. 5,427,595 (Pihl et al.), the entire disclosure of which is incorporated herein by reference.

Commercially available thermoplastic elastomers include segmented polyester thermoplastic elastomers, segmented polyurethane thermoplastic elastomers, segmented polyamide thermoplastic elastomers, blends of thermoplastic elastomers and thermoplastic polymers, and ionomeric thermoplastic elastomers.

"Segmented thermoplastic elastomer", as used herein, refers to the sub-class of thermoplastic elastomers which are based on polymers which are the reaction product of a high equivalent weight polyfunctional monomer and a low equivalent weight polyfunctional monomer. Segmented thermoplastic elastomers are preferably the condensation reaction product of a high equivalent weight polyfunctional monomer having an average functionality of at least 2 and an equivalent weight of at least about 350, and a low equivalent weight polyfunctional monomer having an average functionality of at least about 2 and an equivalent weight of less than about 300. The high equivalent weight polyfunctional monomer is capable on polymerization of forming a soft segment, and the low equivalent weight polyfunctional monomer is capable on polymerization of forming a hard segment. Segmented thermoplastic elastomers useful in the present invention include polyester TPEs, polyurethane TPEs, and polyamide TPEs, and silicone elastomer/polyimide block copolymeric TPEs, with the low and high equivalent weight polyfunctional monomers selected appropriately to produce the respective TPE.

The segmented TPEs preferably include "chain extenders", low molecular weight (typically having an equivalent weight less than 300) compounds having about 2 to 8 active hydrogen functionality, and which are known in the TPE art. Particularly preferred examples include ethylene diamine and 1,4-butanediol.

"Ionomeric thermoplastic elastomers" refers to a sub-class of thermoplastic elastomers based on ionic polymers (ionomers). Ionomeric thermoplastic elastomers are composed of two or more flexible polymeric chains bound together at a plurality of positions by ionic associations or clusters. The ionomers are typically prepared by co-polymerization of a functionalized monomer with an olefinic unsaturated monomer, or direct functionalization of a preformed polymer. Carboxyl-functionalized ionomers are obtained by direct co-polymerization of acrylic or methacrylic acid with ethylene, styrene and similar co-monomers by free-radical co-polymerization. The resulting copolymer is generally available as the free acid, which can be neutralized to the degree desired with metal hydroxides, metal acetates, and similar salts. A review of ionomer history and patents is provided in Legge et al., pp. 231–243.

"Thermoplastic polymer", or "TP" as used herein, has a more limiting definition than the general definition, which is "a material which softens and flows upon application of pressure and heat." It will of course be realized that TPEs meet the general definition of TP, since TPEs will also flow upon application of pressure and heat. It is thus necessary to be more specific in the definition of "thermoplastic" for the purposes of this invention. "Thermoplastic" as used herein, means a material which flows upon application of pressure and heat, but which does not possess the elastic properties of an elastomer when below its melting temperature.

Blends of TPE and TP materials are also within the invention, allowing even greater flexibility in tailoring mechanical properties of the abrasive filaments of the invention.

Commercially available and preferred segmented polyester PTEs for the present invention include those known under the trade designations "HYTREL 4056", " HYTREL 5526", " HYTREL 5556", " HYTREL 6356", " HYTREL 7246", and "HYTREL 8238" available from E.I. DuPont de Nemours and Company, Inc., Wilmington, Del., with the most preferred including HYTREL 5526, HYTREL 5556, and HYTREL 6356. A similar family of polyester TPEs is available under the tradename "RITEFLEX" (Hoechst Celanese Corporation). Still further useful polyester TPEs are those known under the trade designations "ECDEL" from Eastman Chemical Products, Inc., Kingsport, Term., "LOMOD", from General Electric Company, Pittsfield, Mass., "ARNITEL" from DSM Engineered Plastics; and "BEXLOY" from Du Pont. Further useful polyester TPEs include those available as "LUBRICOMP" from LNP Engineering Plastics, Exton, Pa.

Commercially available segmented polyamide TPEs include those known under the trade designation "PEBAX" and "RILSAN" both available from Atochem Inc., Glen Rock, N.J.

Commercially available segmented polyurethane TPEs include those known under the trade designation "ESTANE", available from B. F. Goodrich, Cleveland, Ohio. Other segmented polyurethanes include those known under the trade designations "PELLETHANE", and "ISOPLAST" from The Dow Corning Company, Midland, Mich., and those known under the trade designation "Morthane" from Morton Chemical Division, Morton Thiokol, Inc.; and those known under the trade designation "ELASTOLLAN" from BASF Corporation.

Polymeric materials, including TPEs, are available with various physical properties for the final, cured material. Examples of such physical properties include melting point, freezing point, hardness, toughness, brittleness, and the like. For brush segment 10, according to the present invention, it is preferred to that the hardness, reported as a Shore D hardness, is at least about 65 and no more that about 90. Depending on the particular construction of brush segment 10, a preferred range for the hardness is about 70 to 85 Shore D. Shore D is sometimes referred to as durometer.

Abrasive Particles

Abrasive particles 26 in brush segment 10 are silicon carbide abrasive particles typically have a particle size of about 1 to 1000 micrometers, preferably between 50 and 500 micrometers. The average particle size is typically measured by the longest dimension. As used herein, the term abrasive particle also encompasses single abrasive particles that are bonded together to form an abrasive agglomerate. The silicon carbide particles are preferably present in the bristle at a weight percent (per total weight of moldable polymer and organic abrasive particles) of about 5 to about 80 weight percent, more preferably about 20 to about 45 weight percent. Brush segment 10 may include two or more sizes of silicon carbide abrasive particles.

Brush segment 10 may include additional types of abrasive particles in addition to silicon carbide. These additional abrasive particles may be organic or inorganic. Examples of suitable inorganic abrasive particles include alumina or aluminum oxide, (such as fused aluminum oxide, heat treated fused aluminum oxide, ceramic aluminum oxide, heat treated aluminum oxide), titanium diboride, alumina zirconia, diamond, boron carbide, ceria, aluminum silicates, cubic boron nitride, garnet, silica, and combinations thereof. Preferred fused aluminum oxides include those available commercially pretreated by Exolon ESK Company, Tonawanda, N.Y., or Washington Mills Electro Minerals Corp. Preferred ceramic aluminum oxide abrasive particles include those described in U.S. Pat. Nos. 4,314,827; 4,623,364; 4,744,802; 4,770,671; 4,881,951; 4,964,883; 5,011,508; and 5,164,348, the contents of all of which are incorporated herein by reference. Other examples of particles useful for this invention include solid glass spheres, hollow glass spheres, calcium carbonate, polymeric bubbles, silicates, aluminum trihydrate, and mullite.

Organic abrasive particles suitable for use silicon carbide abrasive particles within brush segment 10 are preferably formed from a thermoplastic polymer and/or a thermosetting polymer. Organic abrasive particles can be formed from a thermoplastic material such as polycarbonate, polyetherimide, polyester, polyvinyl chloride, methacrylate, methylmethacrylate, polyethylene, polysulfone, polystyrene, acrylonitrile-butadiene-styrene block copolymer, polypropylene, acetal polymers, polyurethanes, polyamide, and combinations thereof. In general, preferred thermoplastic polymers of the invention are those having a high melting temperature, e.g. greater than 200° C., more preferably greater than 300° C.; or, have good heat resistance properties. The organic abrasive particle may be a mixture of a thermoplastic polymer and a thermosetting polymer. The organic abrasive particles should have a higher melting or softening point that the polymeric matrix, so that the organic particles are not substantially affected by the manufacturing process. The organic particle should be capable of maintaining a generally particulate state during brush segment processing, and therefore should be selected so as not to substantially melt or soften during the manufacturing process.

A preferred organic abrasive particle is a metal and mold cleaning plastic blast media available commercially as "MC" blast media from Maxi Blast Inc., South Bend, Ind., available with an antistatic coating, but preferably untreated. The "MC" media is a 99% melamine formaldehyde condensate, an amino thermoset plastic.

The abrasive particles, either inorganic or organic, can have any precise shape or can be irregularly or randomly shaped. Examples of such three dimensional shapes includes: pyramids, cylinders, cones, spheres, blocks, cubes, polygons, and the like. Alternatively, the organic abrasive particles can be relatively flat and have a cross sectional shape such as a diamond, cross, circle, triangle, rectangle, square, oval, octagon, pentagon, hexagon, polygon and the like. Shaped abrasive particles, and methods of making them, are taught in U.S. Pat. Nos. 5,009,676; 5,185,012; 5,244,477; and 5,372,620, the contents of all of which are incorporated herein by reference. Shaped thermosetting organic abrasive particles can be made in accordance with the teachings of the U.S. Pat. No. 5,500,273, "Precisely Shaped Particles and Method of Making Same" (Holmes et al.), which is incorporated herein by reference.

The surface of the abrasive particles (a portion of their surface, or the entire surface) may be treated with coupling agents to enhance adhesion to and/or dispersibility in the polymeric matrix. The abrasive particles are not required to be uniformly dispersed in brush segment 10, but a uniform dispersion may provide more consistent abrasion characteristics.

Lubricant

For PCB applications, it is preferred that moldable polymer 28 include a silicone lubricant mixed therein. The presence of a lubricant in polymer 28 reduces the friction of the bristle contacting the circuit board surface. This reduces the heat generated when refining and reduces the presence of "smear". Excessive heat may cause the brush segment to leave residue or smear on the circuit board or to otherwise harm the circuit board.

An example of a preferred silicone material, described in U.S. Pat. No. 5,849,052; entitled "Abrasive Article having a Bond System Comprising a Polysiloxane" (Barber), the description of the silicone material being incorporated herein by reference, is a high molecular weight polysiloxane. Another preferred polysiloxane is a polydimethylsiloxane. Polysiloxanes are available in many different forms, e.g., as the compound itself or as a concentrate. Examples of the polymers into which the polysiloxane can be compounded include polypropylene, polyethylene, polystyrene, polyamides, polyacetal, acrylonitrile-butadiene-styrene (ABS), and polyester elastomer, all of which are commercially available. Silicone modified HYTREL is available commercially as "MB50-010" from Dow Corning Company. Typically, commercially available concentrates may contain a polysiloxane at a weight percent ranging from 40 to 50; however, any weight percent is acceptable for purposes of the invention as long as the desired weight percent in the final product can be achieved. Lubricants preferably can be present in the moldable polymer 28 in amounts of at least 2 wt-% and up to about 20 wt-% (exclusive of abrasive particle content), and preferably in an amount about 5 to 15%, although more or less may be used as desired.

Additives

Moldable polymeric material 28 may further include optional additives, such as, for example, fillers (including grinding aids), fibers, antistatic agents, antioxidants, processing aids, UV stabilizers, flame retardants, lubricants, wetting agents, surfactants, pigments, dyes, coupling agents, plasticizers, and suspending agents. The amounts of these materials are selected to provide the properties desired.

Coupling Agent

Moldable polymeric material 28 may include a coupling agent to improve the bond between the binder and the abrasive particles. Examples of such coupling agents suitable for this invention include organo silanes, zircoaluminates and titanates. Preferred silane coupling agents, typically amine functional such as gamma-aminopropyltriethoxysilane, are commercially available as A-1100, or 1102 from Union Carbide Corporation, New York, N.Y. Abrasive particles 26 may be pretreated with a coupling agent prior to being mixed with moldable polymer 28. Alternatively, the coupling agent may be added directly to moldable polymer 28.

Fillers

Moldable polymeric material 28 may include a filler. Examples of useful fillers include metal carbonates (such as calcium carbonate (chalk, calcite, marl, travertine, marble and limestone), calcium magnesium carbonate, sodium carbonate, magnesium carbonate), silica (such as quartz, glass beads, glass bubbles and glass fibers), silicates (such as talc, clays (montmorillonite), feldspar, mica, calcium silicate, calcium metasilicate, sodium aluminosilicate, sodium silicate), metal sulfates (such as calcium sulfate, barium sulfate, sodium sulfate, aluminum sodium sulfate, aluminum sulfate), gypsum, vermiculite, wood flour, aluminum trihydrate, carbon black, metal oxides (such as calcium oxide (lime), aluminum oxide, titanium dioxide), and metal sulfites (such as calcium sulfite).

Grinding Aids

Polymeric material 28 may further include a grinding aid present therein. A grinding aid is defined herein as a material the addition of which has a significant effect on the chemical and physical processes of abrading which results in improved performance. In particular, it is believed in the art that the grinding aid will either (1) decrease the friction between the abrasive particles and the circuit board being abraded, (2) prevent the abrasive particle from "capping", i.e. prevent metal particles from becoming welded to the tops of the abrasive particles, (3) decrease the interface temperature between the abrasive particles the workpiece, or (4) decrease the grinding forces. Examples of chemical groups of grinding aids include waxes, organic halide compounds, halide salts and metals and their alloys. Other miscellaneous grinding aids include sulfur, organic sulfur compounds, graphite and metallic sulfides.

Injection Molding

Brush segment 10 of the present invention is preferably injection molded; injection molding techniques are known in the art. Segment 10, is produced, by the following general procedure. A mixture of pellets comprising moldable polymer 28, abrasive particles 26 and any optional materials, such as lubricant, is placed in a hopper. Alternatively, it is possible to mix abrasive particles 26 with a pellet form of moldable polymer 28 and load this in the hopper; any optional materials may be separate or mixed into the polymer pellets. Any of the materials may be dried (e.g., by heat) prior to feeding. The hopper feeds the mixture into an input end of a screw injector generally having an auger within a barrel. The output end of the screw injector includes a nozzle for passing the softened mixture into a brush segment mold. The barrel is heated to melt the polymeric material, and the rotating auger propels the mixture in the direction of the output nozzle. The auger is then moved linearly to impart the "shot" of the softened mixture into the mold at the desired pressure. A gap is generally maintained between the output end of the auger and the nozzle to provide a "cushion" area of softened material which is not injected into the mold.

The mold contains cavities which are the inverse of the desired brush segment configuration. Thus the mold design must take into account the brush segment configuration including the size and configuration of center portion 12, bristles 18, and optional attachment means such as apertures 19.

The conditions under which the brush segment is injection molded are determined by the injection molder employed, the configuration of brush segment 10, and the composition of moldable polymer 28 and abrasive particles 26. In one preferred method, the barrel temperature of the screw injector is preferably about 200 to 250° C. The temperature of the mold is preferably about 50 to 150° C. The cycle time (the time from introducing the mixture into the screw extruder to opening the mold to remove the molded brush segment) is usually 0.5 to 180 seconds, more preferably about 5 to 60 seconds. The injection pressure ranges about 690 to 6,900 kPa (100 to 1000 psi), more typically about 2070 to 4830 kPa (300 to 700 psi).

The injection mold cycle will depend upon the material composition and the brush segment configuration. In one preferred embodiment for making a brush segment, the moldable polymer and abrasive particles are generally homogenous throughout brush segment 10. In such an embodiment, there will be a single insertion or shot of mixture of the polymeric material 28 and abrasive particle 26 to mold brush segment 10, including center portion 12 and bristles 18. Alternatively, bristles 18 may contain abrasive particles 26, but center portion 12 does not. In such an embodiment, there will be two insertions or shots of material. The first insertion will contain a mixture of moldable polymer 28 and abrasive particles 26 to primarily fill the bristle portion of the mold. The second insertion will contain moldable polymer (which may be the same or different from the moldable polymer of the first insertion) without abrasive particles to primarily fill the center portion and root portions 20 of the mold. Likewise, center portion 12 and bristles 18 may contain abrasive particles 26, while root 20 may not. In this construction there will be two insertions or shot of material. The first insertion will contain a mixture of moldable polymer 28 and abrasive particles 26 to fill the bristle and center portion portions of the mold. The second insertion will contain only a moldable polymer (which may be the same or different from the moldable polymer of the first insertion) to primarily fill the attachment means portion of the mold. It is also possible to use more than one shot to vary the color of different portions of the brush segment if desired. It is also possible to use three or more shots, for example one each for the bristles, center portion, and attachment means.

After injection molding, the mold is cooled to solidify the moldable polymer. The mold halves are then separated to allow removal of molded brush segment 10.

Method of Refining a Printed Circuit Board

As discussed above, molded brush segment 10 and brush assembly 100 according to the present invention are used to refine the surface of a printed circuit board (PCB).

During the manufacture of PCBs, a copper layer is laminated to a composite insulating board (frequently, an epoxy-glass board). Holes are then drilled in prescribed locations in the laminate. Prior to subsequent manufacturing steps, it is vital that burrs from the drilling step be removed and that the surface of the composite board is thoroughly cleaned. Brush segment 10 functions by removing a portion of the PCB surface, thus imparting a surface finish to the PCB, and cleaning the PCB surface. Brush segment 10, of the invention, removes the burrs around the drilled holes, and does not clog or plug the holes, with brush or bristle material.

A plurality of brush segments 10 are generally assembled to provide brush assembly 100. Individual segments 10 may be placed on a core or shaft, and then secured together to form brush assembly 100. Alternately, a plurality of individual segments 10 may be ganged together and then slid onto a core or shaft. One preferred method for assembling and mounting brush assembly 100 is disclosed in U.S. Pat. No. 5,327,601 (Nakayama et al.), which discussed making two halves of a brush assembly, on a core, and then clamping the two halves onto a driven shaft.

Referring to FIG. 6, a schematic diagram of a method of refining a printed circuit board (PCB). PCB is illustrated with brush assembly 100 contacting PCB at surface 30. A common machine used for PCB finishing or refining is a "PCB Scrubbing Machine", available from Ishii Hyoki Machine Company, of Japan. Such a machine is available for use with a 200-volt power source, and having a 2.2 kW or 3.7 kW rated spindle motor. Both "2 head" and "4 head" machines are known and are common.

Typically pressures between PCB surface 30 and brush 100 are 0–3 amperes (for brush assembly 100 being about 12–24 inches wide), preferably 0.5–2 amperes.

The PCB is fed through the PCB Scrubbing Machine at a speed of 0.5–10 m/min, usually 1–3 m/min. Brush assembly 100 or segment 10 can be rotated at any suitable speed, preferably in the range of about 100 to 15,000 rpm, although higher or lower speeds can be used as desired. Typical rotation speeds for a PCB Scrubbing Machine are 500–3000 rpm (for a 6 inch diameter brush), usually about 1500–2000 rpm. It is understood that the relative speed between PCB surface 30 and brush 100 will affect the surface finish obtained.

The usual surface finish or roughness desired on PCB surface 30, for "deburring" is about 0.05–3 micrometer Ra, preferably 0.1–0.2 micrometer Ra. The usual surface finish desired for cleaning prior to dry film lamination is 0.05–0.2 micrometer Ra, preferably 0.05–0.15 micrometer Ra.

Also as illustrated in FIG. 6, brush 100 will create a footprint "F", which is the length along surface 30 where bristles 18 contact surface 30. In this footprint F area, the interference "D" is the depth to which bristles 18 would have extended if surface 30 was not present. These brush dynamics (the relationship between interference, footprint and pressure) affect the surface finish provided by brush 100.

EXAMPLES

The following non-limiting examples will further illustrate the invention. All parts, percentages, ratios, etc., in the examples are by weight unless otherwise indicated. The following abbreviations listed in Table 1 are used throughout the Examples.

TABLE 1

| Abbrev. | Description |
| --- | --- |
| TPE 1 | TPE, commercially available from E.I. DuPont de Nemours, Wilmington, DE, under the trade designation HYTREL 5526, having hardness Shore D 55 |
| TPE 2 | TPE, commercially available from DuPont under the trade designation HYTREL 6356, having hardness Shore D 63 |
| TPE 3 | TPE, commercially available from DuPont under the trade designation HYTREL 7246, having hardness Shore D 72 |
| TPE 4 | TPE, commercially available from DuPont under the trade designation HYTREL 8238, having hardness Shore D 83 |
| MB 50 | a pelletized, masterbatch composition consisting of 50 wt % HYTREL 6356 and 50 wt % polysiloxane lubricant, obtained from Dow Corning Corporation, Midland, MI under the trade designation "MB50-010" |
| SCA1 | silicon carbide abrasive particles, ANSI grade 400 (average particle size about 22 micrometers) available from Washington Mills Electro Minerals Corp., Niagara Falls, NY |
| SCA2 | silicon carbide abrasive particles, FEPA grade P400 (average particle size about 35 micrometers) available from Washington Mills |
| AO | aluminum oxide abrasive particles, FEPA grade P400 (average particle size about 35 micrometers) available from Treibacher Chemische Werke AG, Villach, Austria, under the trade designation ALUDOR P400 FRPL |
| COLORANT | blue colorant, available from Clariant Corp., Masterbatches Division, Minneapolis, MN under the trade designation No. NE54642490 |

Examples 1–6 and Comparative Example B

Molded brushes of Examples 1 through 6 and Comparative Example B were made by injection molding the compositions shown in Table 2 in a TOYO Ti90, 90 ton injection molding machine from Toyo Machinery & Metal Co., Ltd in Hyogo, Japan. The mold provided 1 cavity to produce radial brush segments of 15.24 cm (6 inch) outer diameter×1.27 mm (0.05 in) thick×7.62 (3 in.) inner diameter. The brush segment had 394 bristles evenly spaced around the periphery. Individual bristles were 1.27 cm (0.5 in) long, were an average of 0.040 inch wide at the base and tapered to 0.025 inch at the bristle tip, and were radially disposed about the periphery.

119 brush segments were mounted on a phenolic core and adhered to the core using an epoxy adhesive to make a 17.78 cm (7 inch) wide brush. The cut and finish performance, the brush dynamics (the relationship between interference, footprint and pressure), and deburring performance were measured for each example.

TABLE 2

| Example | Abrasive Particles | Binder type | Abrasive wt % | MB 50 wt % | Binder wt % | Colorant wt % |
| --- | --- | --- | --- | --- | --- | --- |
| 1 | SCA1 | TPE 1 | 30.31 | 9.92 | 59.53 | 0 |
| 2 | SCA1 | TPE 2 | 27.52 | 10.35 | 62.13 | 0 |
| 3 | SCA1 | TPE 3 | 27.78 | 10.32 | 61.90 | 0 |
| 4 | SCA1 | TPE 4 | 20.66 | 11.33 | 68.01 | 0 |
| 5 | SCA2 | TPE 3 | 27.50 | 10.36 | 62.14 | 0 |
| 6 | SCA2 | TPE 4 | 27.50 | 10.36 | 62.14 | 0 |
| Comp. B | AO | 49% TPE1 51% TPE2 | 38.00 | 14.00 | 45.00 | 3 |

Comparative Examples A and C–E

The brushes of Comparative Examples A, C, D and E were commercially available brushes as described in Table 3.

TABLE 3

| Example | Type | Commercial Designation/description |
| --- | --- | --- |
| Comp. A | Molded | "400 T-C Radial Bristle Brush", 6 inch, FEPA grade P400 Al$_2$O$_3$, available from 3M Company, St. Paul, MN |

TABLE 3-continued

| Example | Type | Commercial Designation/description |
| --- | --- | --- |
| Comp. C | Bristle | Bristle Brush made by BRUSHLON bristles, #320 (ANSI grade 320 SiC), trim length 10 mm, 150 × 610 × 76.2, obtained from TOWA Brush Company, Japan |
| Comp. D | Bristle | Bristle Brush made by BRUSHLON, #500 (ANSI grade 500 SiC), trim length 10 mm, 150 × 610 × 76.2 mm, obtained from TOWA Brush Company, Japan |
| Comp. E | Nonwoven flaps | "SCOTCH-BRITE FD Flap Brush FD6S-UFF, 150 × 610 × 76.2 mm, obtained from Sumitomo 3M Limited, Tokyo, Japan |

The Example and Comparative Example brushes were subjected to various tests, described below.

Cut and Finish Test

The Cut and Finish test demonstrated the ability of each sample brush to recondition the surface of a printed circuit board.

Sample brushes were mounted on a PCB Scrubbing Machine (Ishii Hyoki Machine Company, Japan) having an ammeter to read the electric current draw (known as "pressure" in the art) under various loads. The PCB Scrubbing machine was set to rotate the test brush at 1800 rpm. A pre-weighed printed circuit board specimen, 150 mm×200 mm×1.6 mm thick having an array of holes drilled through the board, was fed twice consecutively through the scrubbing machine at 2 meters/minute. The electric current draw was recorded. The printed circuit board specimen was weighed again and the surface finish ($R_a$) was measured using a Surface Roughness Tester Model SV-600 from Mitsutoyo Company.

Figure 7:
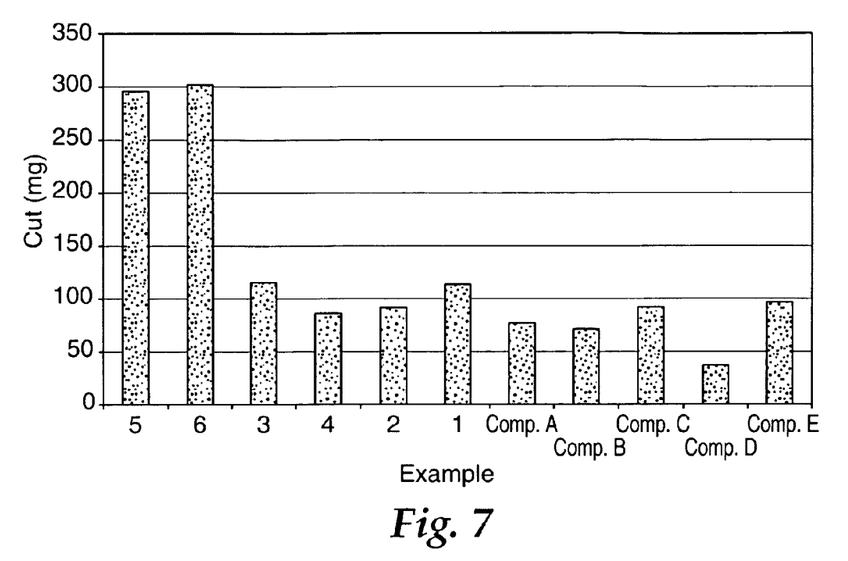
FIG. 7 is a graphical representation of cut results from the Cut and Finish Test, testing brushes according to the present invention and comparative brushes.
Figure 8:
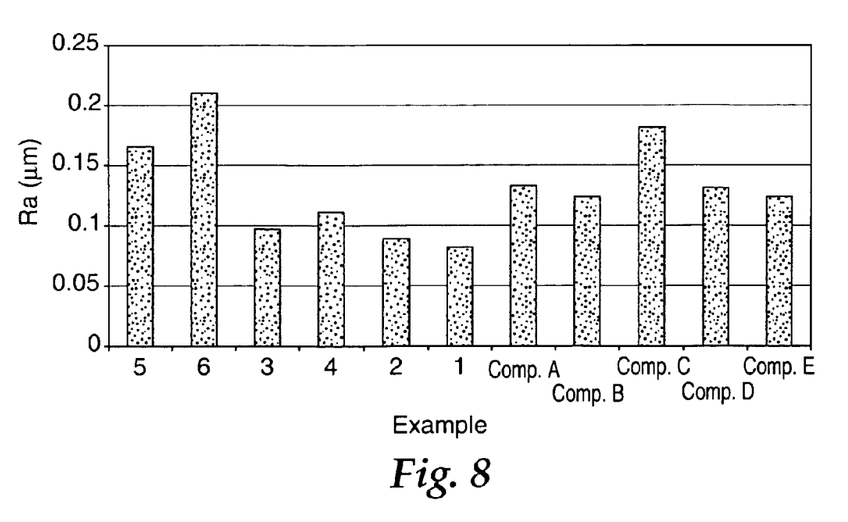
FIG. 8 is a graphical representation of surface finish rests from the Cut and Finish Test, testing brushes according to the present invention and comparative brushes.

Test results are shown in FIG. 7 (cut) and FIG. 8 (surface finish). The data shown for Examples 5 and 6 were extrapolated based on results from running a similar test, however with 2.54 cm (1 inch) wide brushes and comparing the results to results obtained when Examples 3 and 4 and Comparative Example E were run on that test with 2.54 cm brushes.

The Cut and Finish test shows that Examples 5 and 6, having silicon abrasive particles with an average size of about 35 micrometers, provided large amounts of cut. Examples 1–4 provided acceptable cut results, as did Comparative Examples A, B, D and E.

The surface finish results from the Cut and Finish test show that Examples 1 through 4 provided the smoothest finishes. It was expected that the larger abrasive particles, in Examples 5 and 6, would provide a rougher surface finish.

Deburring and Hole Plugging Test

The PCB specimens used in the above Cut and Finish Test procedure were examined under an optical microscope at 500× magnification. Photomicrographs were taken and examined subjectively for relative deburring effectiveness and the presence of plugged holes. The holes would get plugged or clogged, either partially or completely, with material from the brush bristles.

Upon such microscopic examination, boards finished with Comparative Example E showed frequent residual in the drilled holes. Boards finished with Comparative Examples A through D and Examples 1–6 showed no residual material in the holes. All Example brushes acceptably de-burred the printed circuit boards.

The results from the Deburring and Hole Plugging Test show that all molded brushes (Examples 1–6 and Comparative Examples A and B) and all bristle brushes (Comparative Examples C, D and E) provided sufficient deburring and non-clogging of holes in the PCB. Comparative Example F, the nonwoven flap brush, was unacceptable.

Footprint Test

The Footprint Test demonstrated relative dynamic stiffness of each example brush when urged against the surface of a copper plate under a known load. FIG. 6 is a schematic illustration of the footprint of the brush during use. The stiffer the bristles, the smaller the footprint F, due to less bending of the bristles during use, and the stiffer the bristles, the less the interference depth "D" under the same pressure or load.

Sample brushes, 15.2 cm outer diameter×17.8 cm wide×7.6 cm inner diameter (6"×7"×3"), were mounted on the PCB Scrubbing machine, described above in the Cut and Finish Test.

Figure 9:
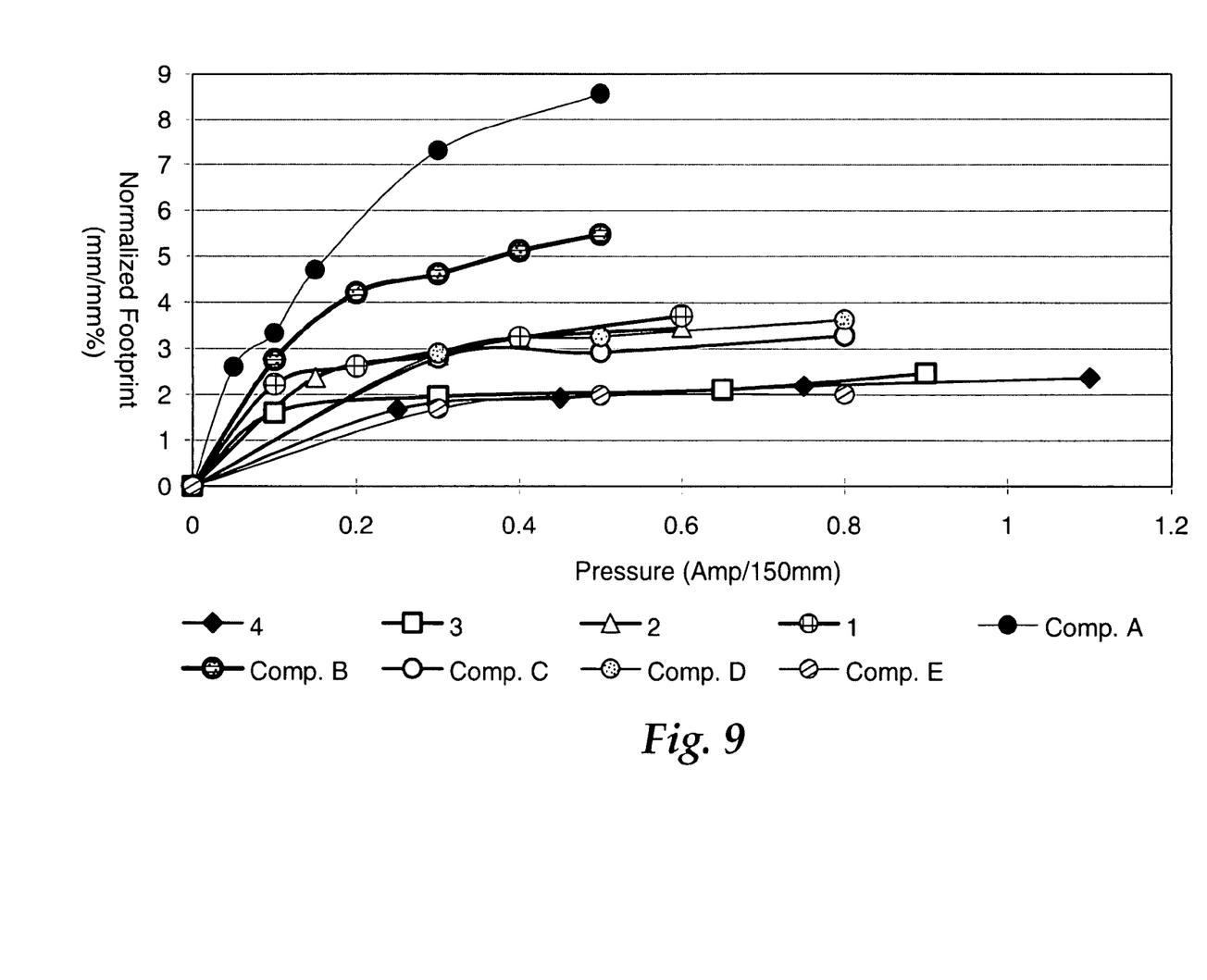
FIG. 9 is a graphical representation of results from the Footprint Test, testing brushes according to the present invention and comparative brushes.

The load was measured via an ammeter that indicated the electrical current demand of the PCB Scrubbing machine under the test conditions. For each test condition, the 150 mm×200 mm×1.6 mm thick printed circuit board was urged against the rotating (1800 rpm) test brush to cause a predetermined electrical load. The contact time under these conditions was three seconds. The length of the resulting abraded contact area on the board was measured and the results are shown in FIG. 9.

The results from the Footprints Test show that Examples 1 and 2 have a dynamic stiffness similar to that of Comparative Examples C and D, and that Examples 3 and 4 have a dynamic stiffness similar to that of Comparative Example E. Comparative Examples A and B have a much lower stiffness, indicated by the larger footprint. During refining in commercial settings, generally a stiffer brush, indicated by a shorter footprint, is desired.

The above testing was done with a 15.2 cm (6 inch) diameter by 17.8 cm (7 inch) wide brush. For such a brush, being tested on a 150 mm wide test sample (i.e., the contact width), it has been determined that the desired footprint length is 6 to 14 mm, which is about 1.25% to about 2.75% of the brush circumference. One skilled in the art will realize that although the same stiffness bristles are used, as the brush size differs, so will the footprint length. For example, a 10.2 cm (4 inch) diameter brush has a desired footprint length of about 4 to 10 mm; a 20.3 cm (8 inch) diameter brush has a desired footprint length of about 8 to 19 mm. Depending on the refining method and the specific brush used, footprint lengths at least 0.5% may be suitable, and lengths no greater than about 5% may be suitable. In still further embodiments, footprints lengths ranging from about 1% to about 3% may be suitable.

Wear Test

The Wear Test compared the relative amount of wear in test brushes when subjected to simulated end use conditions. The results from the Wear Test provide a comparison of the relative product life.

A pre-weighed test brush 152 mm outer diameter (6 in)×25 mm wide (1 in)×76 mm inner diameter (3 in), consisting of 21 individual radial brush segments, was mounted on a Floor Lathe and Robot Tester machine (available from Tohoku Denki Tekko, Japan). The test machine was set to drive the test brush at 2000 rpm. The tester applied a known downward load against a 76 mm×127 mm×0.8 mm thick copper plate workpiece (C1100P, tough pitch copper). The copper plate was urged against the test brush to achieve a load of 5.0 kg while the plate was oscillated in its long dimension at 2.25 m/min along a 75 mm path for 30 minutes.

Figure 10:
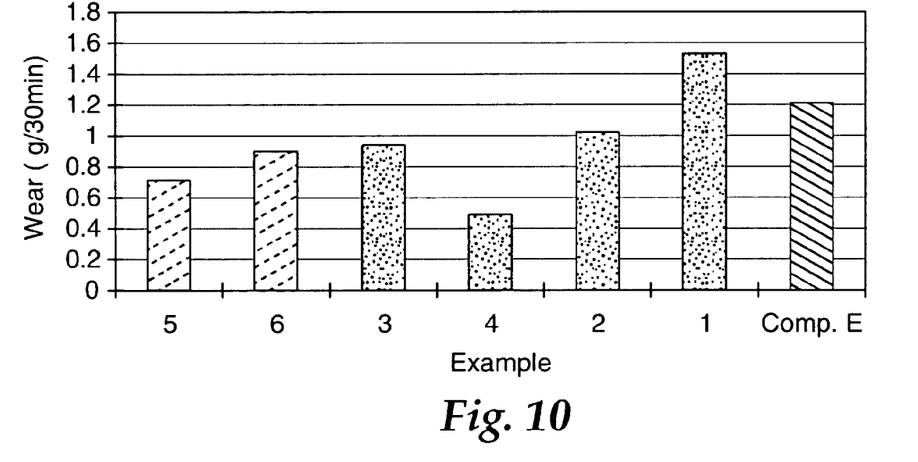
FIG. 10 is a graphical representation of results from the Wear Test, testing brushes according to the present invention and comparative brushes.

The brush was weighed again and the difference was recorded as wear. Wear Test results are shown in FIG. 10.

The present invention has now been described with reference to several embodiments thereof. The foregoing detailed description and examples have been given for clarity of understanding only. No unnecessary limitations are to be understood therefrom. It will be apparent to those skilled in the art that many changes can be made in the embodiments described without departing from the scope of the invention. Thus, the scope of the present invention should not be limited to the exact details and structures described herein, but rather by the structures described by the language of the claims, and the equivalents of those structures.

The above specification, examples and data provide a complete description of the manufacture and use of the abrasive article of the disclosure. Since many embodiments can be made without departing from the spirit and scope of the disclosure and the invention, the invention resides in the claims hereinafter appended.

What is claimed:

1. A method of refining a surface of a printed circuit board, the method comprising:
   (a) providing a brush comprising:
      (i) a plurality of bristles integrally molded with a central portion of the brush, the bristles comprising thermoplastic polymer, polysiloxane lubricant, and silicon carbide abrasive particles, the thermoplastic polymer having a Shore D hardness of 55–90;
      (ii) the plurality of bristles having a length of 0.0625 inch to 1.5 inch;
   (b) contacting the brush with the surface of a printed circuit board comprising a copper surface and having apertures therethrough;
   (c) refining the surface to provide a copper surface having a surface finish of 0.05 to 0.3 micrometer Ra.

2. The method according to claim 1, wherein the step of providing a brush comprises:
   (a) providing a brush comprising a plurality of bristles having a length of 0.25 inch to 0.5 inch.

3. The method according to claim 1, wherein the step of providing a brush comprises:
   (a) providing a brush having bristles comprising a thermoplastic polymer having a Shore D hardness of 70–85.

4. The method according to claim 1, wherein the step of providing a brush comprises:
   (a) providing a brush having bristles comprising 2–20 wt-% polysiloxane lubricant.

5. The method according to claim 4, wherein the step of providing a brush comprises:
   (a) providing a brush having bristles comprising 5–15 wt-% polysiloxane lubricant.

6. The method according to claim 1, wherein the step of providing a brush comprises:
   (a) providing a brush having bristles comprising 20–45 wt-% silicon carbide particles.

7. The method according to claim 1, wherein the step of providing a brush comprises:
   (a) providing a brush having bristles with a cross-section 0.01 to 0.05 inch wide and 0.01 to 0.05 inch high.

8. The method according to claim 7, wherein the step of providing a brush comprises:
   (a) providing a brush having bristles with a cross-section 0.025 inch wide and 0.025 inch high.

9. The method according to claim 1, wherein the step of providing a brush comprises:
   (a) providing a brush having bristles with a cross-section that is a trapezoid.

10. The method according to claim 1, wherein the step of refining the surface comprises:
    (a) refining the surface to provide a surface finish of 0.1 to 0.2 micrometer Ra.

11. The method according to claim 1, wherein the step of refining the surface comprises:
    (a) refining the surface to provide unplugged apertures.

12. The method according to claim 1, wherein the step of contacting the brush with the surface of a printed circuit board comprises:
    (a) contacting the brush with the surface of the printed circuit board to create a footprint that is 1.25% to 2.75% of a circumference of the brush with a 150 mm wide contact width.

13. A method of refining a surface of a printed circuit board, the method comprising:
    (a) providing a brush comprising:
       (i) a plurality of bristles integrally molded with a central portion of the brush, the bristles comprising thermoplastic polymer, polysiloxane lubricant, and silicon carbide abrasive particles, the thermoplastic polymer having a Shore D hardness of 55–90;
       (ii) the plurality of bristles having a length of 0.0625 inch to 1.5 inch;
    (b) contacting the brush with the surface of a printed circuit board comprising a copper surface and having apertures therethrough;
    (c) refining the surface to provide a copper surface having a finish with unplugged apertures.

14. The method according to claim 13, wherein refining the surface further comprises refining the surface to provide a copper surface having a surface finish of 0.05 to 0.3 micrometer Ra.

15. A method of refining a surface of a printed circuit board, the method comprising:
    (a) providing a brush comprising:
       (i) a plurality of bristles integrally molded with a central portion of the brush, the bristles comprising thermoplastic polymer, polysiloxane lubricant, and silicon carbide abrasive particles, the thermoplastic polymer having a Shore D hardness of 55–90;
       (ii) the plurality of bristles having a length of 0.0625 inch to 1.5 inch;
    (b) contacting the brush with the surface of a printed circuit board comprising a copper surface and having apertures therethrough, wherein contacting the brush with the surface of the printed circuit board creates a footprint that is 1.25% to 2.75% of a circumference of the brush.

16. The method of claim 15, further comprising refining the surface to provide a copper surface having a surface finish of 0.05 to 0.3 micrometer Ra and with unplugged apertures.

* * * * *